(12) United States Patent
Liang et al.

(10) Patent No.: US 8,379,394 B2
(45) Date of Patent: Feb. 19, 2013

(54) SLIDING EXPANSION DATA CARD

(75) Inventors: Luoyi Liang, Shenzhen (CN); Xialing Zhang, Shenzhen (CN)

(73) Assignee: Huawei Device Co., Ltd., Shenzhen (CN)

(*) Notice: Subject to any disclaimer, the term of this patent is extended or adjusted under 35 U.S.C. 154(b) by 222 days.

(21) Appl. No.: 12/875,320

(22) Filed: Sep. 3, 2010

(65) Prior Publication Data
US 2011/0058344 A1  Mar. 10, 2011

(30) Foreign Application Priority Data
Sep. 10, 2009 (CN) ................. 2009 2 0169528 U

(51) Int. Cl.
*H05K 1/14* (2006.01)
(52) U.S. Cl. .............. 361/737; 361/715; 361/752
(58) Field of Classification Search .......... 361/715, 361/727, 737, 752, 796, 800; 439/76.1, 607.31–607.34
See application file for complete search history.

(56) References Cited

U.S. PATENT DOCUMENTS

| 7,121,850 | B2* | 10/2006 | Yeh ...................... 439/131 |
| 7,410,370 | B2* | 8/2008 | Sprouse et al. .............. 439/95 |
| 7,416,419 | B2* | 8/2008 | Collantes et al. ........... 439/76.1 |
| 7,462,044 | B1* | 12/2008 | Regen et al. ............... 439/131 |
| 7,811,101 | B2* | 10/2010 | Tang et al. ................. 439/131 |
| 8,059,394 | B2* | 11/2011 | Wang ....................... 361/679.32 |
| 2008/0045049 | A1 | 2/2008 | Collantes et al. |
| 2008/0233776 | A1 | 9/2008 | Tang et al. |

FOREIGN PATENT DOCUMENTS

| CN | 2599779 Y | 1/2004 |
| CN | 2678164 Y | 2/2005 |

OTHER PUBLICATIONS

European Search Report, European Application No. 10175965.2-2224, Applicant: Huawei Technologies Co., Ltd., Dated: Feb. 2, 2011, 5 pages.

* cited by examiner

*Primary Examiner* — Hung S Bui
(74) *Attorney, Agent, or Firm* — Slater & Matsil, L.L.P.

(57) ABSTRACT

A sliding expansion data card includes a data card interface, a spring plate, a main bearing plate, and a shield. The data card interface is set at one end of the main bearing plate. One end of the spring plate is set on the shield which is located on the lower surface of the main bearing plate, and the other end contacts the data card interface.

20 Claims, 1 Drawing Sheet

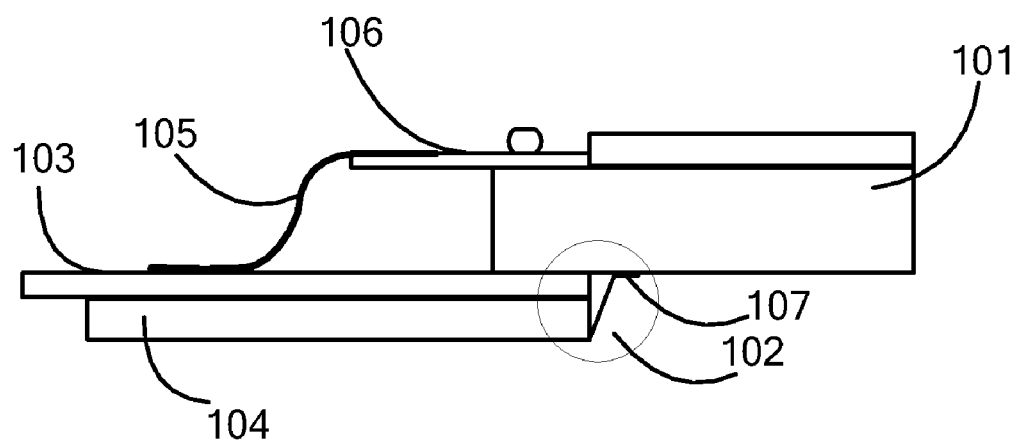

SLIDING EXPANSION DATA CARD

This application claims priority to Chinese Patent Application 200920169528.6, which was filed Sep. 10, 2009 and is incorporated herein by reference.

TECHNICAL FIELD

The present invention relates to a data card connected to computers and communications devices, and in particular embodiments, to a sliding expansion data card.

BACKGROUND

In electronic products, the grounding performance of a circuit system determines the circuit performance, especially the electromagnetic compatibility (EMC), of a product. Among all the universal serial bus (USB) sliding expansion data cards, a data card with a sliding expansion USB connector includes a USB connector bearing plate, a sliding soft plate, a deck bearing plate, a main bearing plate, and a standard USB interface. The USB connector bearing plate is configured to fix the standard USB interface. The sliding soft plate is connected between the deck bearing plate and the USB connector bearing plate. The sliding flexibility of the standard USB interface is implemented through the sliding expansion soft plate. The main bearing plate is configured to bear the main circuits of the data card.

SUMMARY

During the implementation of the present invention, the inventor discovers the following problem in the prior art. The grounding loop of the data card with a sliding expansion USB connector can be implemented through a back-to-back (BTB) connector, the deck bearing plate, the sliding soft plate, and the USB connector. Because the data card with a sliding expansion USB connector has a long grounding loop path, the grounding effect is poor.

To overcome the problem in the prior art where the grounding effect is poor due to the long grounding loop path of the data card with a sliding expansion USB connector, an embodiment of the present invention provides a sliding expansion data card.

A sliding expansion data card includes a data card interface, a spring plate, a main bearing plate, and a shield, where the data card interface is set at one end of the main bearing plate, one end of the spring plate is set on the shield which is located on the lower surface of the main bearing plate, and the other end contacts the data card interface.

According to the above description, the spring plate is set on the shield which is located on the lower surface of the main bearing plate at the data card interface side, and the spring plate contacts the data card interface, so that the sliding expansion data card enables static electricity on the main bearing plate to flow from the data card interface to the earth directly through the spring plate. Thus, the grounding loop is shorter and the grounding effect is better.

BRIEF DESCRIPTION OF THE DRAWINGS

The FIGURE shows a structure of a sliding expansion data card in an embodiment of the present invention.

DETAILED DESCRIPTION OF ILLUSTRATIVE EMBODIMENTS

The following describes a sliding expansion data card provided in an embodiment of the present invention with reference to the accompanying drawing.

The FIGURE shows a structure of a sliding expansion data card in an embodiment of the present invention. The following describes the sliding expansion data card taking that the data card interface is a USB interface as an example. The data card includes a USB interface 101, a spring plate 102, and a main bearing plate 103, and a shield 104. The USB interface 101 is set at one end of the main bearing plate 103. The shield 104 is located on the lower surface of the main bearing plate 103. One end of the spring plate 102 is set on the shield 104 and the other end of the spring plate 102 contacts the USB interface 101.

One end of the spring plate may be fixed beside the shield 104 which is located on the lower surface of the main bearing plate 103 at the data card interface side. When the USB interface 101 is connected with an external device, the other end of the spring plate 102 contacts the USB interface 101.

It should be noted that a tongue 107 is also set at the other end of the spring plate 102. The tongue 107 of the spring plate 102 contacts the USB interface 101. One end of the spring plate 102 is fixed on the shield 104 which is located on the lower surface of the main bearing plate 103 at the USB interface 101 side. The width of the spring plate 102 is not greater than the width of the data card interface. The thickness of the spring plate 102 is not greater than the thickness of the shield 104. The width of the tongue 107 of the spring plate 102 ranges from 0.2 mm to 0.3 mm. When the USB interface 101 is connected with an external device, the tongue 107 at the other end of the spring plate 102 contacts the USB interface 101.

It should be noted that the data card further includes a USB interface connector bearing plate 106 and a sliding soft plate 105. One end of the USB interface connector bearing plate 106 is connected with the sliding soft plate 105, and the other end is configured to fix the USB interface 101. The USB interface connector bearing plate 106 is moved to drive the USB interface 101 to slide on the main bearing plate 103.

The sliding soft plate 105 may be a flexible printed circuit (FPC).

By using the sliding expansion data card provided in the embodiment of the present invention, the spring plate is set on the shield which is located on the lower surface of the main bearing plate at the data card interface side, and the spring plate contacts the data card interface, so that the sliding expansion data card enables static electricity on the main bearing plate to flow from the data card interface to the earth directly through the spring plate. Thus, the grounding loop is shorter and the grounding effect is better. The spring plate is set beside the shield which is located on the lower surface of the main bearing plate at the data card side, so that the grounding spring plate of the sliding expansion data card not only occupies less space on the main bearing plate, but also improves the grounding effect of the main bearing plate.

Although the present invention has been described through an exemplary embodiment and the accompanying drawing, the present invention is not limited to the embodiment. It is apparent that those skilled in the art can make various modifications and variations to the present invention without departing from the scope of the present invention. The present invention shall cover the modifications and variations provided that they fall within the protection scope defined by the claims or their equivalents.

What is claimed is:

1. A sliding expansion data card, comprising:
 a main bearing plate;
 a data card interface;
 a shield located on a lower surface of the main bearing plate;

a spring plate, one end of the spring plate being set on the shield, wherein, when the data card interface is connected with an external device, an opposite end of the spring plate contacts the data card interface; and a data card interface connector bearing plate and a sliding soft plate, wherein one end of the data card interface connector bearing plate is connected with the sliding soft plate and an opposite end is configured to fix the data card interface.

2. The sliding expansion data card of claim 1, wherein the shield is located on the lower surface of the main bearing plate adjacent the data card interface.

3. The sliding expansion data card of claim 2, wherein the one end of the spring plate is fixed beside the shield.

4. The sliding expansion data card of claim 1, further comprising a tongue set on the opposite end of the spring plate.

5. The sliding expansion data card of claim 4, wherein when the data card interface is connected with the external device, the tongue contacts the data card interface.

6. The sliding expansion data card of claim 4, wherein the spring plate has a width that is not greater than a width of the data card interface.

7. The sliding expansion data card of claim 6, wherein the spring plate has a thickness that is not greater than a thickness of the shield.

8. The sliding expansion data card of claim 6, wherein the width of the tongue is between 0.2 mm to 0.3 mm.

9. The sliding expansion data card of claim 1, wherein the data card interface connector bearing plate is moved to drive the data card interface to slide on the main bearing plate.

10. The sliding expansion data card of claim 1, wherein the sliding soft plate comprises a flexible printed circuit.

11. The sliding expansion data card of claim 1, wherein the data card interface is a universal serial bus (USB) interface.

12. A sliding expansion data card, comprising:
a main bearing plate;
a data card interface;
a shield located on a lower surface of the main bearing plate;
a spring plate, one end of the spring plate being set on the shield, wherein, when the data card interface is connected with an external device, an opposite end of the spring plate contacts the data card interface; and
a data card interface connector bearing plate and a sliding soft plate, wherein the data card interface connector bearing plate is configured to fix the data card interface, wherein the data card interface connector bearing plate is connected with one end of the sliding soft plate and another end of the sliding soft plate is connected with the main bearing plate, and wherein the data card interface connector bearing plate is moved to push the data card interface to slide on the main bearing plate.

13. The sliding expansion data card of claim 12, wherein the shield is located on the lower surface of the main bearing plate adjacent the data card interface.

14. The sliding expansion data card of claim 13, wherein the one end of the spring plate is fixed beside the shield.

15. The sliding expansion data card of claim 12, further comprising a tongue set on the opposite end of the spring plate.

16. The sliding expansion data card of claim 15, wherein when the data card interface is connected with the external device, the tongue contacts the data card interface.

17. The sliding expansion data card of claim 15, wherein the spring plate has a width that is not greater than a width of the data card interface.

18. The sliding expansion data card of claim 17, wherein the spring plate has a thickness that is not greater than a thickness of the shield.

19. The sliding expansion data card of claim 17, wherein the width of the tongue is between 0.2 mm to 0.3 mm.

20. The sliding expansion data card of claim 12, wherein the sliding soft plate comprises a flexible printed circuit.

* * * * *